United States Patent
Yoo et al.

(10) Patent No.: US 8,963,454 B2
(45) Date of Patent: Feb. 24, 2015

(54) APPARATUS FOR CONTROLLING COMPRESSOR

(75) Inventors: Jaeyoo Yoo, Seoul (KR); Boram Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 77 days.

(21) Appl. No.: 13/477,389

(22) Filed: May 22, 2012

(65) Prior Publication Data

US 2012/0301323 A1    Nov. 29, 2012

(30) Foreign Application Priority Data

May 23, 2011   (KR) .................. 10-2011-0048682

(51) Int. Cl.
*H02K 33/00* (2006.01)
*F04B 35/04* (2006.01)
*F04B 49/06* (2006.01)

(52) U.S. Cl.
CPC .............. *F04B 35/04* (2013.01); *F04B 49/06* (2013.01); *F04B 2203/0201* (2013.01)
USPC ................ 318/119; 318/400.24; 417/44.1

(58) Field of Classification Search
USPC ............ 318/119, 126, 128, 400.24; 417/44.1, 417/44.11
See application file for complete search history.

(56) References Cited

U.S. PATENT DOCUMENTS

| | | | | |
|---|---|---|---|---|
| 4,481,451 A * | 11/1984 | Kautz et al. | | 318/628 |
| 5,883,478 A * | 3/1999 | Thesling | | 318/119 |
| 6,554,577 B2 * | 4/2003 | Park et al. | | 417/44.1 |
| 6,565,327 B2 * | 5/2003 | Yoo et al. | | 417/44.1 |
| 8,221,090 B2 * | 7/2012 | Kim et al. | | 417/44.11 |
| 8,277,199 B2 * | 10/2012 | Yoo et al. | | 417/44.11 |
| 8,371,824 B2 * | 2/2013 | Jeong et al. | | 417/44.11 |
| 8,531,139 B2 * | 9/2013 | Murata | | 318/128 |
| 8,550,789 B2 * | 10/2013 | Hu et al. | | 417/44.11 |
| 2002/0064461 A1 | 5/2002 | Yoo et al. | | 417/44.1 |
| 2008/0131292 A1 * | 6/2008 | Hong et al. | | 417/44.1 |
| 2008/0157724 A1 * | 7/2008 | Fattal | | 322/7 |
| 2008/0238349 A1 * | 10/2008 | Cheng | | 318/400.05 |
| 2009/0072802 A1 * | 3/2009 | Andoh et al. | | 323/275 |
| 2009/0155765 A1 * | 6/2009 | Atwood et al. | | 435/3 |
| 2011/0215641 A1 * | 9/2011 | Peterson et al. | | 307/23 |

FOREIGN PATENT DOCUMENTS

| | | | |
|---|---|---|---|
| CN | 1288285 A | 3/2001 | |
| CN | 1400389 A | 3/2003 | |
| CN | 1430702 A | 7/2003 | |

(Continued)

OTHER PUBLICATIONS

James Karki, Fully-Differential amplifiers, Texas Instruments, Jan. 2002, pp. 1-16.*

(Continued)

*Primary Examiner* — Rina Duda
*Assistant Examiner* — Bickey Dhakal
(74) *Attorney, Agent, or Firm* — Ked & Associates, LLP

(57) ABSTRACT

An apparatus for controlling a compressor is provided. When grounding the apparatus for controlling a compressor, an analog circuit ground and a digital circuit ground may be insulated from each other to protect the apparatus. A ground of an analog circuit driven by commercial alternating current (AC) power, and a ground of a digital circuit driven by a voltage which has been converted from commercial AC power, may also be insulated from each other by a simple circuit device to protect a controller inside the digital circuit.

13 Claims, 3 Drawing Sheets

(56) References Cited

FOREIGN PATENT DOCUMENTS

| KR | 10-2010-0046472 | 6/2001 |
| KR | 10-0687901 | 2/2007 |

OTHER PUBLICATIONS

Korea Notice of Allowance issued in KR Application No. 10-2011-0048682 dated Sep. 21, 2012.

Chinese Office Action dated Apr. 24, 2014 issued in related application No. 201210162711.X.

* cited by examiner

US 8,963,454 B2

APPARATUS FOR CONTROLLING COMPRESSOR

CROSS-REFERENCE TO RELATED APPLICATION(S)

This application claims priority under 35 U.S.C. §119 to Korean Application No. 10-2011-0048682 filed on May 23, 2011, whose entire disclosure is hereby incorporated by reference.

BACKGROUND

1. Field

This relates to an apparatus for controlling a compressor.

2. Background

Generally, a compressor converts mechanical energy into compression energy, and may be part of a refrigerating system such as a refrigerator or an air conditioner. Compressors may be categorized into reciprocating compressors configured to compress refrigerant as a piston performs a reciprocating motion in a cylinder, with a compression space formed between the piston and the cylinder; rotary compressors configured to compress refrigerant as a roller rotates along an inner wall of a cylinder, with a compression space formed between the roller and the cylinder; and scroll compressors configured to compress refrigerant as an orbiting scroll rotates along a fixed scroll, with a compression space formed between the orbiting scroll and the fixed scroll.

BRIEF DESCRIPTION OF THE DRAWINGS

The embodiments will be described in detail with reference to the following drawings in which like reference numerals refer to like elements wherein.

DETAILED DESCRIPTION

Figure 1:
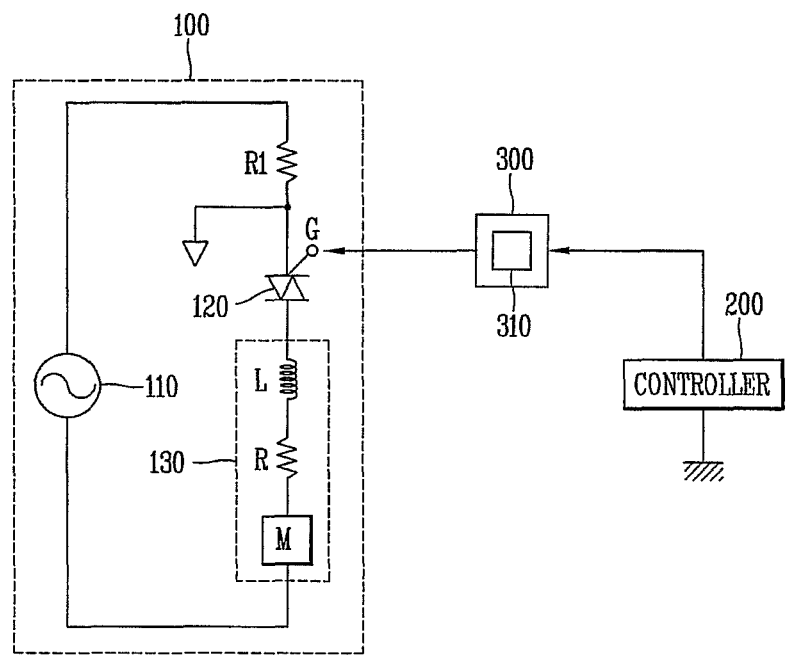
FIG. 1 is a schematic view of an apparatus for controlling a compressor according to one embodiment as broadly described herein.

A detailed description will now be provided of various exemplary embodiments, with reference to the accompanying drawings. For the sake of brief description with reference to the drawings, the same or equivalent components will be referred to by the same reference numbers, and detailed description thereof will not be repeated.

A reciprocating compressor may operate in accordance with a Reciprocating method or a Linear method depending on how the piston is driven. In the Reciprocating method, a crankshaft is coupled to a motor and a piston is coupled to the crankshaft, so that a rotational motion of the motor is converted into a reciprocating motion of the piston. In the Linear method, a piston is connected to a mover of a motor which performs a linear motion, so as to perform a reciprocating motion in response to the linear motion of the motor.

Such a reciprocating compressor includes a motor unit configured to generate a driving force, and a compression unit configured to compress a fluid by receiving a driving force from the motor unit. In the Linear method, a linear motor may be used as the motor unit. Such a linear motor has a relatively simple structure and requires no mechanical conversion device since the linear motor itself generates a linear driving force, and thus can reduce a loss due to energy conversion, and can reduce associated noise due to friction and abrasion. When applying the linear compressor to a refrigerator or an air conditioner, a stroke voltage supplied to the linear compressor is changed to change a compression ratio, allowing the linear compressor to also vary a freezing capacity.

A reciprocating compressor, and in particular, a linear compressor, performs a reciprocating motion in which a piston is not mechanically restricted in a cylinder. This may cause the piston to collide with a wall of the cylinder when an excessive voltage is suddenly applied, causing the piston not to forward move due to an excessive load and resulting in a mal-compression function. A device for controlling movements of a piston in response to a load change or a voltage change may help avoid this problem.

Hereinafter, an apparatus for controlling a compressor capable of controlling a stroke and a voltage or a frequency of a compressor motor will be described. Such an apparatus may include an analogue circuit driven by commercial power, and a digital circuit driven by a predetermined voltage which has been converted from commercial power. The analogue circuit and the digital circuit may be insulated from each other.

Hereinafter, a reciprocating compressor, in particular, a linear compressor to which the apparatus for controlling a compressor as embodied and broadly described herein may be applied, will be explained in brief. However, the exemplary linear compressor may have its components partially changed or deleted, or added with other components when necessary.

In the linear compressor, an inlet pipe and an outlet pipe through which refrigerant is introduced and discharged are installed at one side of a hermetic container, and a cylinder is fixed to an inner side of the hermetic container. A piston is installed in the cylinder so as to perform a reciprocating motion, so that a refrigerant sucked into a compression space inside the cylinder can be compressed. Springs are installed in a moving direction of the piston to be supported by an elastic force. The piston is connected to a linear motor which generates a reciprocating driving force, and the linear motor controls a stroke of the piston so that a compression capacity can be changed. A suction valve is installed at one end of the piston contacting the compression space, and a discharge valve assembly is installed at one end of the cylinder contacting the compression space. The suction valve and the discharge valve assembly are automatically controlled, and are open and closed according to an inner pressure of the compression space. The hermetic container has a hermetic inner side with upper and lower shells coupled to each other, and an inlet pipe and an outlet pipe through which refrigerant is introduced and discharged are installed at one side of the hermetic container. The piston is elastically supported in the cylinder in a moving direction so as to perform a reciprocating motion, and a linear motor is assembled at an outer side of the cylinder by a frame. Such an assembly is elastically supported on an inner bottom surface of the hermetic container by a supporting spring. Oil remains on the inner bottom surface of the hermetic container. An oil supplying device configured to pump oil is installed at a lower end of the assembly. And, an oil supplying pipe configured to supply oil to a gap between the piston and the cylinder is formed in a lower frame of the assembly. The oil supplying device is operated by vibrations generated when the piston performs a reciprocating motion, thereby pumping oil. Such oil is supplied to a gap between the piston and the cylinder, thereby performing a cooling and lubrication function.

The cylinder is formed in a hollow shape so that the piston can perform a reciprocating motion therein, and a compression space is formed at one side of the cylinder. And, the cylinder is positioned so that one end thereof is close to inside of the inlet pipe, and is installed on the same line as the inlet pipe. The piston is installed in one end of the cylinder adjacent to the inlet pipe, so as to perform a reciprocating motion. And, the discharge valve assembly is installed at another end of the cylinder opposite to the inlet pipe. The discharge valve assembly includes a discharge cover which forms a discharge space of the cylinder, a discharge valve configured to open and close one end of the cylinder which is disposed at a side of a compression space, and a valve spring, a type of coil spring configured to provide an elastic force to a gap between the discharge cover and the discharge valve in an axial direction. An O-ring is provided on an inner circumference of one end of the cylinder, and the discharge valve is tightly attached to one end of the cylinder. A bent loop pipe is installed between one side of the discharge cover and the outlet pipe. The loop pipe is configured to guide a compressed refrigerant to be discharged out, and is configured to reduce vibrations from being transferred to the entire part of the hermetic container. Such vibrations occur from reciprocal operation of the cylinder, the piston and the linear motor. A refrigerant flow path is formed at the piston, so that a refrigerant introduced from the inlet pipe can flow therethrough. The refrigerant flow path is installed so that one end thereof close to the inlet pipe can be directly connected to the linear motor by a connection member, and a suction valve is installed at another end of the refrigerant flow path opposite to the inlet pipe. And, the refrigerant flow path is installed so as to be elastically supported by all types of springs in a moving direction of the piston. Here, the suction valve is formed in a thin plate shape, and a central part thereof is partially cut so that the refrigerant flow path of the piston can be open and closed. One side of the suction valve is fixed to one end of the piston by screws.

While the piston performs a reciprocating motion in the cylinder, if pressure of the compression space is less than a suction pressure lower than a discharge pressure, the suction valve is open to allow a refrigerant to be drawn into the compression space. On the other hand, if the pressure of the compression space is greater than the suction pressure, the suction valve is closed to allow the refrigerant in the compression space to be compressed.

The linear motor may include an inner stator fixed to an outer side of the cylinder by a frame, with a plurality of laminations disposed in a circumferential direction; an outer stator fixed to an outer side of the cylinder by a frame, with a gap from the inner stator, with a plurality of laminations disposed in a circumferential direction on a coil winding body for winding a coil thereon; and a permanent magnet disposed at a gap between the inner stator and the outer stator, and connected to the piston by a connection member. The coil winding body may be fixed to an outer side of the inner stator. Once a current is applied to the coil winding body of the linear motor, an electromagnetic force occurs. The permanent magnet performs a reciprocating motion in a reciprocal manner with the generated electromagnetic force, and the piston connected to the permanent magnet performs a reciprocating motion in the cylinder.

Referring to FIG. 1, an apparatus for controlling a compressor as embodied and broadly described herein may include an alternating current (AC) switch 120 connected to commercial power source 110, or external power source, for supplying power to the compressor, and driven by a gate signal to open and close the compressor; a controller 200 configured to generate a gate driving signal; and an insulating circuit 310 configured to insulate an analogue ground of the commercial power source 110 and the AC switch 120 from a digital ground of the controller 200. The AC switch 120 may be, for example, a Triac, which is directly connected to commercial AC power and driven according to a signal input to a gate thereof. Hereafter, a reference number 100 represents an analogue circuit, 130 represents a compressor, L and R represent internal inductance and internal resistance of the compressor 130 respectively, and M represents a motor included in the compressor 130. Also, a reference number R1 represents resistance of a resistor for sensing a current applied to the compressor 130.

The apparatus may also include a driver 300 disposed between the controller 200 and the AC switch 120, and configured to drive the AC switch 120 according to the gate driving signal.

Figure 2:
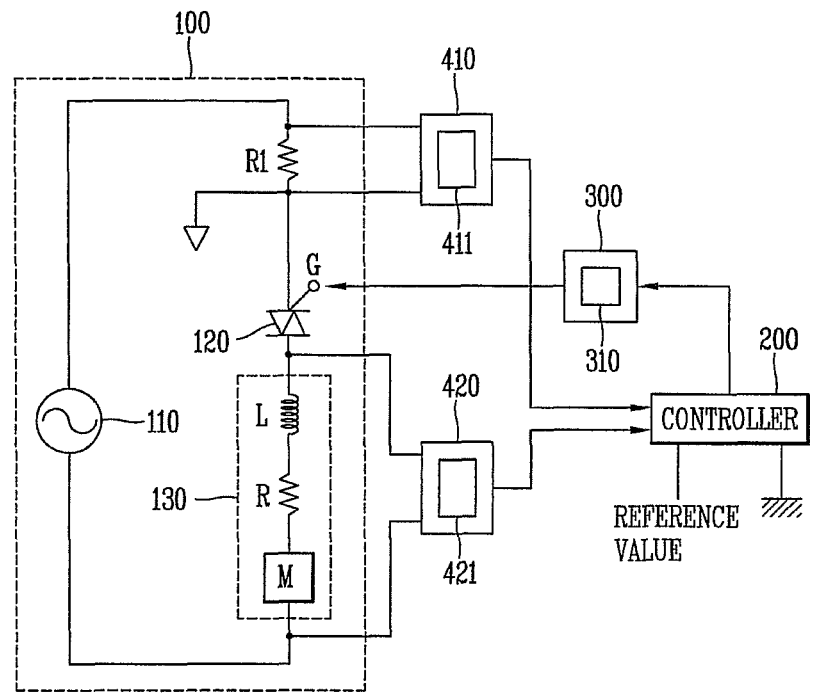
FIG. 2 is a schematic view of an apparatus for controlling a compressor according to another embodiment as broadly described herein.

Referring to FIG. 2, an apparatus for controlling a compressor according to another embodiment as embodied and broadly described herein may include an alternating current (AC) switch 120 connected to a commercial power 110 for supplying power to the compressor, and configured to open and close the compressor by being driven by a gate driving signal; a controller 200 configured to generate a gate driving signal; insulating circuits 411 and 421 configured to insulate an analogue ground of the commercial power 110 and the AC switch 120, from a digital ground of the controller 200; a current detector 410 configured to detect a driving current applied to the compressor; and a voltage detector 420 configured to detect a driving voltage applied to the compressor. The apparatus may also include an insulating circuit 310 and a driver 300 disposed between the controller 200 and the AC switch 120, and configured to drive the AC switch 120 according to the gate driving signal.

Figure 4:
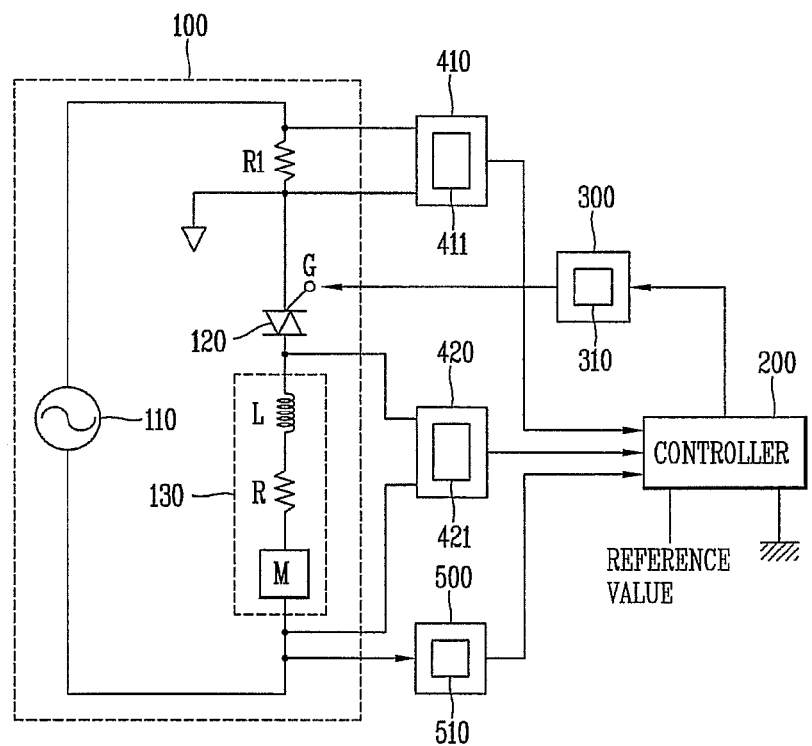
FIG. 4 is a schematic view of an apparatus for controlling a compressor according to still another embodiment as broadly described herein.

Referring to FIG. 4, an apparatus for controlling a compressor according to still another embodiment as embodied and broadly described herein may include an alternating current (AC) switch 120 connected to a commercial power 110 for supplying power to the compressor, and configured to open and close the compressor by being driven by a gate driving signal; a controller 200 configured to generate a gate driving signal; insulating circuits 411, 421 and 510 configured to insulate an analogue ground of the commercial power 110 and the AC switch 120, from a digital ground of the controller 200; a current detector 410 configured to detect a driving current applied to the compressor; a voltage detector 420 configured to detect a driving voltage applied to the compressor; and a zero voltage detector 500 configured to detect a zero voltage of the driving voltage. The apparatus may also include an insulating circuit 310 and a driver 300 disposed between the controller 200 and the AC switch 120, and configured to drive the AC switch 120 according to the gate driving signal.

The current detector 410 is configured to detect a driving current applied to the compressor, and to detect a motor current applied to the compressor motor.

The voltage detector 420 is configured to detect a driving voltage applied to the compressor, and to detect a motor voltage applied to two ends of the compressor motor according to a load of the compressor.

Figure 3:
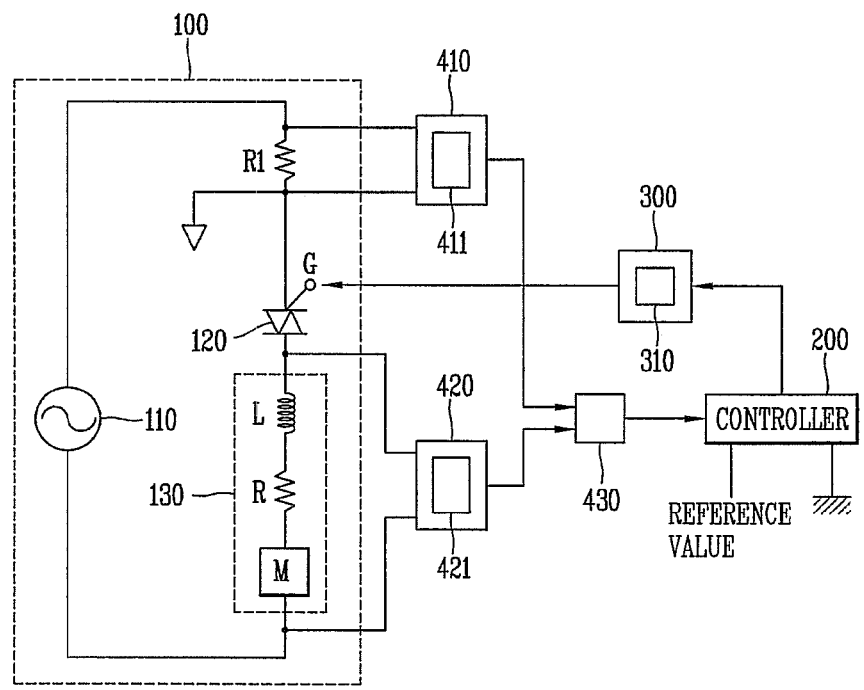
FIG. 3 illustrates a compressor control operation.

As shown in FIG. 3, the apparatus for controlling a compressor as embodied and broadly described herein may also include a stroke calculator 430 configured to calculate a stroke based on the detected current and the detected voltage. A relation among the motor voltage, the motor current and the stroke is shown in the following formula 1. The stroke calculator 430 is configured to calculate a stroke, using the following formula 1, based on a motor voltage detected by the voltage detector 420 and a motor current detected by the current detector 410.

$$x = \frac{1}{\alpha} \int \left( Vm - Ri - L\frac{di}{dt} \right) dt \qquad \text{[Formula 1]}$$

Here, 'x' denotes a stroke, 'a' denotes a motor constant, 'Vm' denotes a motor voltage, 'R' denotes a resistance, 'L' denotes an inductance, and 'i' denotes a motor current.

The controller 200 is configured to receive a reference stroke value, and to compare the received reference stroke value with a stroke value obtained through the stroke calculator 430. And, the controller 200 generates a gate driving signal according to a comparison result between the obtained stroke value and the reference stroke value. Generally, the controller may perform sensorless control, and detailed explanations thereof will be omitted.

Figure 5:
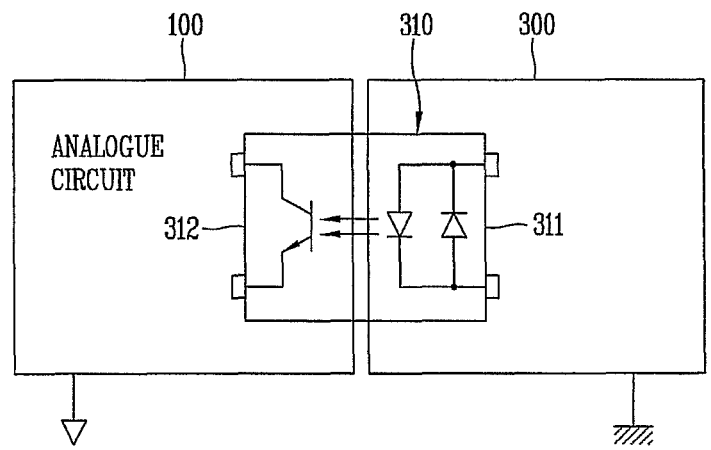
FIGS. 5 and 6 illustrate insulating circuitry of the apparatus for controlling a compressor shown in FIGS. 1 to 4.

The driver 300, a switching circuit or device for driving the AC switch 120 includes an insulating circuit 310. Referring to FIG. 5, the insulating circuit 310 may include, for example, a light emitting device 311 and a light receiving device 312, and may be configured to electrically insulate an analogue ground and a digital ground from each other. And, the insulating circuit 310 includes a device for transferring a signal using light. For instance, the insulating circuit 310 may be a photo coupler, a photo triac, etc.

Figure 6:
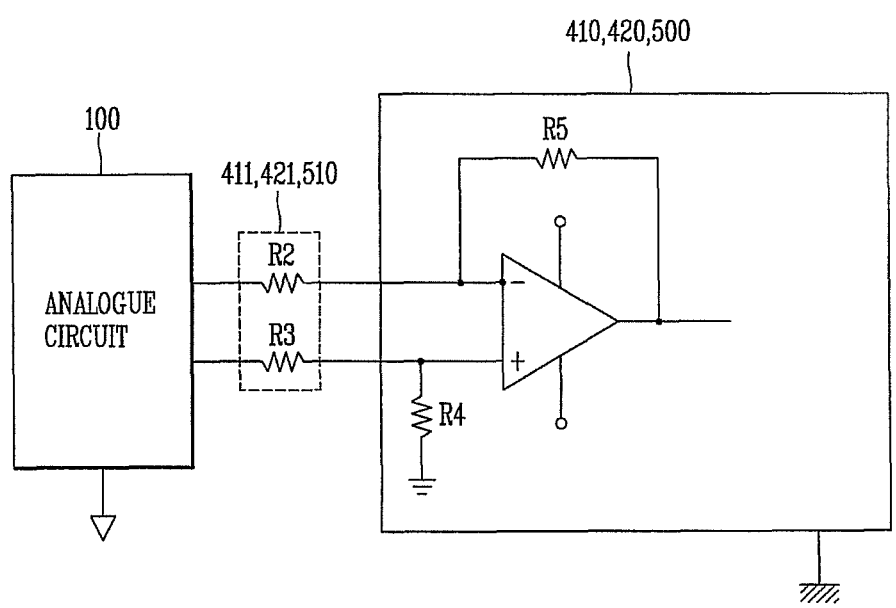

Referring to FIG. 6, each of the current detector 410, the voltage detector 420 and the zero voltage detector 500 may each be implemented as a differential amplifier. The differential amplifier may insulate an analogue circuit and a digital circuit from each other. Such a differential amplifier is provided with input resistances (R2 and R3) for insulating an analogue ground and a digital ground from each other. Each of the input resistances may have a relatively high resistance value, for example, greater than several mega ohm. In FIG. 6, R4 and R5 are resistances which are used for making an amplifying ratio.

In an apparatus for controlling a compressor as embodied and broadly described herein, a problem occurring when an analogue circuit ground and a digital circuit ground are connected to each and not insulated from each other may be solved, enhancing stability of the system, preventing possible accidents, and improving driving efficiency of the compressor.

In an apparatus for controlling a compressor as embodied and broadly described herein, when grounding the apparatus, an analogue circuit ground and a digital circuit ground may be insulated from each other, thus protecting the apparatus for controlling a compressor.

In an apparatus for controlling a compressor as embodied and broadly described herein, a ground of an analogue circuit driven by commercial AC power, and a ground of a digital circuit driven by a voltage which has been converted from commercial AC power, may be insulated from each other by a simple circuit device, thus protecting a controller inside the digital circuit.

Therefore, an apparatus for controlling a compressor is provided that is capable of protecting a controller from power noise.

An apparatus for controlling a compressor is provided that is capable of protecting a controller inside a digital circuit by insulating a ground of an analogue circuit driven by commercial alternating current (AC) power from a ground of a digital circuit.

An apparatus for controlling a compressor as embodied and broadly described herein may include an alternating current (AC) switch connected to commercial power for supplying power to the compressor, and configured to open and close the compressor by being driven by a gate driving signal; a controller configured to generate a gate driving signal; and an insulating circuit configured to insulate an analogue ground of the commercial power and the AC switch, from a digital ground of the controller.

The apparatus may also include a driving unit including the insulating circuit, disposed between the controller and the AC switch, and configured to drive the AC switch according to the gate driving signal.

In accordance with another embodiment as broadly described herein, an apparatus for controlling a compressor may include an alternating current (AC) switch connected to commercial power for supplying power to the compressor, and configured to open and close the compressor by being driven by a gate driving signal; a controller configured to generate a gate driving signal; an insulating circuit configured to insulate an analogue ground of the commercial power and the AC switch, from a digital ground of the controller; a current detection unit configured to detect a driving current applied to the compressor; and a voltage detection unit configured to detect a driving voltage applied to the compressor.

In accordance with still another embodiment as broadly described herein, an apparatus for controlling a compressor may include an alternating current (AC) switch connected to commercial power for supplying power to the compressor, and configured to open and close the compressor by being driven by a gate driving signal; a controller configured to generate a gate driving signal; an insulating circuit configured to insulate an analogue ground of the commercial power and the AC switch, from a digital ground of the controller; a current detection unit configured to detect a driving current applied to the compressor; a voltage detection unit configured to detect a driving voltage applied to the compressor; and a zero voltage detection unit configured to detect a zero voltage of the driving voltage.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for controlling a linear compressor, the apparatus comprising:
   an alternating current (AC) switch configured to be connected to a power source;
   a current detector configured to detect a driving current applied to the linear compressor;
   a voltage detector configured to detect a driving voltage applied to the linear compressor;
   a stroke calculator configured to calculate a stroke based on the detected current and the detected voltage;
   a controller configured to generate a gate driving signal, wherein the AC switch is configured to open and close a connection to the linear compressor based on the gate driving signal, and wherein the gate driving signal is generated based on the calculated stoke; and
   an insulating circuit configured to insulate an analogue ground of an analogue circuit driven by the power source from a digital ground of a digital circuit comprising the controller, wherein the digital circuit is driven by a voltage that has been converted from the power source,
   wherein the current detector includes a differential amplifier having an input resistance such that the power source is prevented from interfering with the controller when the analogue ground is electrically connected to the digital ground.

2. The apparatus of claim 1, further comprising a driver in which the insulating circuit is provided, wherein the driver is positioned between the controller and the AC switch and is configured to drive the AC switch in response to the gate driving signal.

3. The apparatus of claim 2, wherein the insulating circuit includes a light emitting device and a light receiving device, and wherein the insulating circuit is configured to electrically insulate an analogue ground and a digital ground from each other, and is configured to transfer a signal using light.

4. The apparatus of claim 1, wherein the voltage detector includes a first differential amplifier having an input resistance such that the analogue ground does not interfere with the digital ground.

5. The apparatus of claim 1, further comprising a zero voltage detector configured to detect a zero voltage of the driving voltage.

6. The apparatus of claim 5, wherein the zero voltage detector includes a second differential amplifier having an input resistance such that the analogue ground does not interfere with the digital ground.

7. An apparatus for controlling a linear compressor, the apparatus comprising:
   an alternating current (AC) switch connected to a power source for supplying power to the linear compressor;
   a current detector configured to detect a driving current applied to the linear compressor;
   a voltage detector configured to detect a driving voltage applied to the linear compressor;
   a stroke calculator configured to calculate a stroke based on the detected current and the detected voltage; and
   a controller configured to generate a gate driving signal and to transmit the gate driving signal to the AC switch so as to open or close a connection to the compressor accordingly, wherein the gate driving signal is generated based on the calculated stroke;
   wherein the current detector includes a first differential amplifier having an input resistance such that the power source is prevented from interfering the controller when an analogue ground is electrically connected to a digital ground, wherein the analogue ground is a ground of an analogue circuit driven by the power source, and the digital ground is a ground of a digital circuit driven by a voltage that has been converted from the power source, wherein the digital circuit comprises the controller.

8. The apparatus of claim 7, wherein the voltage detector includes a second differential amplifier having an input resistance that is high enough such that the analogue ground does not interfere with the digital ground.

9. The apparatus of claim 7, further comprising a zero voltage detector configured to detect a zero voltage of the driving voltage.

10. The apparatus of claim 9, wherein the zero voltage detector includes a third differential amplifier having an input resistance that is high enough such that the analogue ground does not interfere with the digital ground.

11. The apparatus of claim 7, further comprising a driver positioned between the controller and the AC switch and configured to drive the AC switch according to the gate driving signal.

12. The apparatus of claim 11, wherein the driver includes an insulating circuit configured to insulate an analogue ground of the power source and the AC switch from a digital ground of the controller.

13. The apparatus of claim 12, wherein the insulating circuit includes a light emitting device and a light receiving device, and wherein the insulating circuit is configured to electrically insulate an analogue ground and a digital ground from each other, and is configured to transfer a signal using light.

* * * * *